United States Patent
Yamazaki et al.

[11] Patent Number: 5,824,235
[45] Date of Patent: Oct. 20, 1998

[54] METHOD OF MANUFACTURING SEMICONDUCTOR DEVICE

[75] Inventors: Shunpei Yamazaki, Tokyo; Jun Koyama, Kanagawa, both of Japan

[73] Assignee: Semiconductor Energy Laboratory Co., Ltd., Kanagawa-ken, Japan

[21] Appl. No.: 688,018

[22] Filed: Jul. 29, 1996

[30] Foreign Application Priority Data

Aug. 4, 1995 [JP] Japan .................................. 7-219532
May 8, 1996 [JP] Japan .................................. 8-139456

[51] Int. Cl.$^6$ .......................... H01L 21/00; B44C 1/22
[52] U.S. Cl. .......................... 216/23; 216/13; 216/18; 216/67; 438/720
[58] Field of Search .................................. 216/13, 18, 23, 216/24, 67; 438/30, 710, 720, 722, 723, 724, 742, 743, 744, 609; 349/43, 46

[56] References Cited

U.S. PATENT DOCUMENTS 4,792,210 12/1988 Maurice .................................. 216/23 X
5,234,541 8/1993 Shannon et al. ...................... 216/23 X

*Primary Examiner*—William Powell
*Attorney, Agent, or Firm*—Fish & Richardson P.C.

[57] ABSTRACT

There is provided a technique which prevents semiconductor devices under fabrication from being destroyed by pulse-like high potentials applied by plasma without adding any special fabrication step. A first line extending to a gate electrode of a thin film transistor is formed. A first insulation film is formed on the first line. A second line connected to a source region of the thin film transistor is formed on the insulation film. A second insulation film is formed on the second line. Then, a conductive pattern is formed on the second insulation film. A discharge pattern is formed the first and/or second line, and the first and/or second line is cut simultaneously with the formation of the conductive pattern.

16 Claims, 7 Drawing Sheets

METHOD OF MANUFACTURING SEMICONDUCTOR DEVICE

BACKGROUND OF THE INVENTION

1. Field of the Invention

The invention disclosed in this specification relates to a method of manufacturing an integrated thin film semiconductor device. The invention disclosed in this specification also relates to a method of manufacturing an active matrix type liquid crystal display.

2. Background of the Invention

Active matrix type liquid crystal displays have been conventionally known. They have a configuration wherein a thin film transistor is provided at each of pixel electrodes provided on a glass substrate in a quantity on the order of several hundred thousands. The thin film transistor provided at each pixel electrode has a function of controlling charge going in and out the pixel electrode.

Another configuration is known in which a thin film transistor circuit (referred to as "driver circuit") for driving the thin film transistors provided at the pixel electrodes is integrated on the same glass substrate. This is referred to as "peripheral-integrated active matrix type".

During the manufacture of such an active matrix type liquid crystal display, a phenomenon is encountered in which some of the thin film transistors integrated on the glass substrate malfunction.

The inventors have actively studied this problem and reached the findings described below.

When an integrated semiconductor device such as an active matrix type liquid crystal display is manufactured, the formation of insulation films and wiring is performed using the plasma CVD method or sputtering method and plasma etching.

FIG. 3 schematically illustrates the relationship between the energy (relative value) and quantity (relative value) of ions during generation of plasma. In general, there are relatively not a few high energy ions which give plasma damage to the substrate as indicated by the oblique lines in FIG. 3.

Meanwhile, there is a fact that an insulation film formed using plasma CVD or sputtering is not fine and has a withstand voltage as low as about several tens volts or less. Further, there is a problem that the used substrate is very easily charged because the substrate is made of glass or quartz which is a substantially complete insulator.

FIG. 4(B) illustrates one step of the manufacture of a thin film transistor as illustrated using symbols in FIG. 4(A). FIG. 4(B) shows a state of the formation of a interlayer insulation film 31.

In this case, it is assumed that the interlayer insulation film 31 is formed using plasma CVD or sputtering. It goes without saying that ions having high energy as shown in FIG. 3 collide with the sample during the formation of the film.

In general, a source (S) electrode and a gate (G) electrode are not connected to each other. Therefore, a situation may arise, although only locally, in which a potential difference between the source (S) electrode and the gate (G) electrode instantaneously reaches a value in the range from several tens volts to several hundred volts during a step using a plasma.

The source and gate electrodes are provided with an active layer 32 and a gate insulation film 30 interposed therebetween. The withstand voltage of the gate insulation film 30 formed using CVD or sputtering is several tens volts or less. Therefore, in the above-described situation, the gate insulation film 30 is electrically destroyed.

This causes the thin film transistor to malfunction. This problem can be solved by electrically shorting the source and gate electrode, that is, they have the same electrical potential during the formation of the interlayer insulation film 31. In a state in which the device is finally operated, however, the source and gate electrodes must not be directly electrically shorted.

Taking this into consideration, in the process shown in FIG. 4(B), the source and gate electrodes must be electrically shorted until the final stage, and then, they must be disconnected.

SUMMARY OF THE INVENTION

It is an object of the present invention to provide a technique which solves the problem of the destruction of semiconductor devices in the manufacturing steps as shown in FIG. 4(B). Specifically, it is an object of the invention to provide a technique which prevents semiconductor devices under fabrication from being destroyed by pulse-like high potentials applied by plasma (such high potentials are locally and instantaneously applied).

As illustrated in a specific example of manufacturing steps in FIGS. 2(A) through 2(E), the invention disclosed in this specification is characterized in one aspect thereof in that it includes the steps of:

forming a first wiring 100 extending to a gate electrode 101 of a thin film transistor;

forming a first insulation film 206 on the first wiring;

forming a second wiring 102 connected to a source region 211 of the thin film transistor on the insulation film;

forming a second insulation film 207 on the second wiring; and forming a conductive pattern 214 on the second insulation film, and in that:

the first and/or second wiring is formed with a discharge pattern (see FIGS. 6(A) and 6(B) or see FIG. 7); and the first and/or second wiring is cut (see FIG. 2(E)) simultaneously with the formation of the conductive pattern.

In the above-described configuration, each of the insulation films may have a multilayer structure.

As illustrated in a specific example of manufacturing steps in FIGS. 2(A) through 2(E), according to another aspect of the invention, there is provided a process of manufacturing an active matrix circuit (see FIG. 1) characterized in that it includes the steps of:

forming a first plurality of wirings 101;

forming a first insulation film 206 on the first plurality of wirings;

forming a second plurality of wirings 102 orthogonal to said first plurality of wirings in the form of a lattice on the first insulation film;

forming a second insulation film 207 on the second plurality of wirings; and forming a conductive pattern 214 on the second insulation film, and in that:

the first and/or second wirings are formed with a discharge pattern (see FIGS. 6(A) and 6(B) or FIG. 7); and the first and/or second wirings are cut (see FIG. 2(E)) simultaneously with the formation of the conductive pattern.

The invention is characterized in another aspect thereof in that it includes the steps of:

forming wirings which constitute an active matrix circuit;

forming an insulation film on the wirings; and forming a conductive pattern on the insulation film, and in that:

the wirings includes a discharge pattern; and the wirings including the discharge pattern is cut when the conductive pattern is formed.

For example, this configuration is employed when discharge patterns as shown in FIGS. 6(A), 6(B), and 7 are formed in shorting wirings as indicated by 100 and 114 in FIG. 1 and are disconnected from the wirings 101 and 102 provided in the form of a matrix during the patterning of a pixel electrode 214 (see FIGS. 2(A) through 2(E)).

The invention is characterized in another aspect thereof in that it includes the steps of:

forming wirings which constitute an active matrix circuit;

forming an insulation film on the wirings; and forming a conductive pattern on the insulation film, and in that:

the wirings include a discharge pattern; and the discharge pattern is separated from the wirings that constitute the active matrix circuit when the conductive pattern is formed.

In the process shown in FIGS. 2(A) through 2(E), the wirings 100 and 114 for connecting wirings to each other are cut during the patterning of the pixel electrode 214, which allows the wirings to be shorted before the pixel electrode is patterned.

This makes it possible to suppress a phenomenon that a local high voltage is applied to an insulation film of a semiconductor device under fabrication using a plasma process. Further, by employing a step of cutting such a shorting portion during the patterning of the pixel electrode, a configuration which involves no increase in manufacturing steps can be used.

In addition, by providing discharge patterns as shown in FIG. 6 and FIG. 7 on the wirings 100 and 114 for connecting wirings to each other, a pulse potential propagated through the wirings 100 and 114 can be reduced or eliminated in the middle of a manufacturing step.

DETAILED DESCRIPTION OF THE PREFERRED EMBODIMENTS

A first embodiment of the present invention will now be described.

Figure 1:
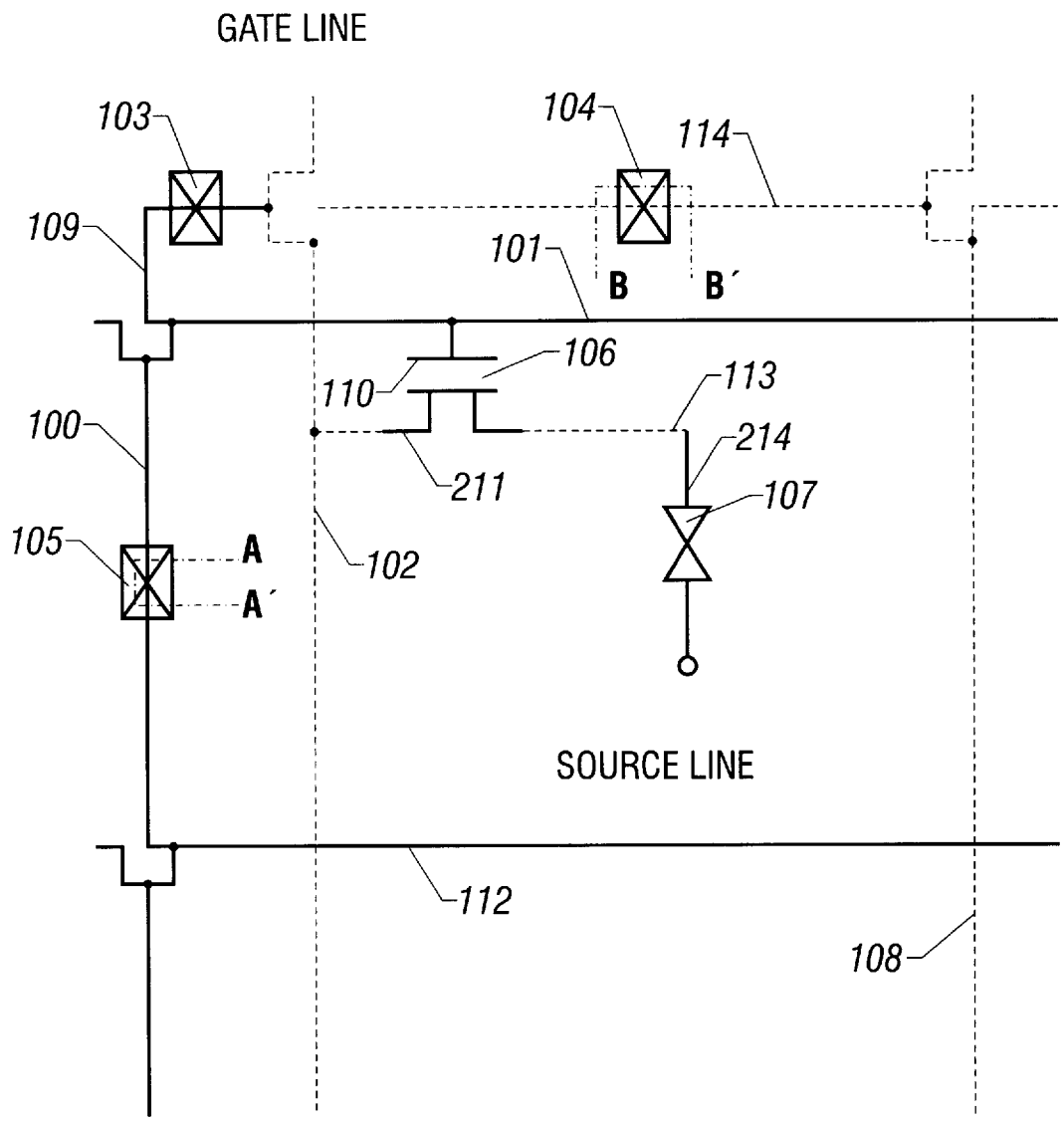
FIG. 1 schematically shows a configuration of an active matrix type liquid crystal display.

In a configuration of an active matrix type liquid crystal display as shown in FIG. 1, the present embodiment is characterized in that regions indicated by 103, 104, and 105 are removed by etching when a pixel electrode (not shown in FIG. 1) is patterned.

The present embodiment will be described with reference to a step of disconnecting a source wiring and a gate wiring which have been provided in an active matrix region and have been connected to each other at the final stage.

A pixel electrode is formed at the final step and no manufacturing step using plasma follows the formation of the pixel electrode. Therefore, the step of forming a pixel electrode may be regarded as the last step which utilizes plasma.

In the present embodiment, for example, a gate wiring 101 and a source wiring 102 are kept in connection by a shorting wiring indicated by 109 before the formation of a pixel electrode. (This wiring is formed simultaneously with the formation of the gate wiring 101.)

That is, the source and gate wirings are electrically shorted until the final step at which plasma is used. That is, a gate electrode 10 and a source electrode 211 of a thin film transistor 106 are connected and are at the same potential.

This prevents a situation in which a voltage of several tens volts or more is applied between the gate electrode 110 and the source electrode 211 (which is provided to extend from the source wiring 102 in FIG. 1) of the thin film transistor 106 even when a local high voltage is unavoidably applied. This makes it possible to prevent the destruction of a thin film transistor under fabrication due to a high potential pulse induced by plasma.

After the deposition of an ITO for pixel electrodes, these wirings are disconnected at the region indicated by 103 during patterning the pixel electrodes to complete the circuit. FIG. 1 shows other regions indicated by 104 and 105 where such cutting is simultaneously performed.

The configuration shown in FIG. 1 allows the gate wirings 101 and 112 and, in addition, the source wirings 102 and 108 to be all at the same potential during the manufacturing process. Further, it can solve the problem of the generation of an unnecessary potential difference during a film forming step or etching step utilizing plasma or electrical discharge.

FIGS. 2(A) through 2(E) are sectional views illustrating fabrication steps of the configuration shown in FIG. 1. FIGS. 2(A) through 2(E) show a sectional fabrication flow diagram of the thin film transistor 106 in the configuration shown in FIG. 1, a fabrication flow diagram for a section of the shorting line 100 extending from the gate wiring 101 taken along the line A–A', and a fabrication flow diagram for a section of the shorting wiring 114 extending from the source wiring 102 taken along the line B-B' on the same drawing. (The sectional configuration actually obtained will be different from those shown in FIGS. 2(A) through 2(E).)

Figure 2A:
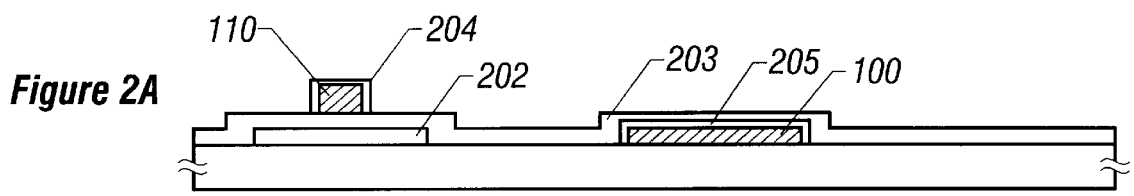
FIGS. 2(A) through 2(E) show steps of manufacturing an active matrix type circuit.

A description will now be made on the fabrication steps shown in FIGS. 2(A) through 2(E). As shown in FIG. 2(A), a silicon oxide film (not shown) is first formed as a base coating film on a glass substrate 201. The structure as shown in FIG. 1 is provided on this glass substrate 201.

Next, an amorphous silicon film is formed to a thickness of 500 Å using the plasma CVD or low pressure thermal CVD. The thickness of this amorphous silicon film may be about 200–2000 Å. Then, a laser beam irradiation and/or heating process is performed on the film. As a result, there is provided a crystallized silicon film which is not shown in the drawings.

The crystallized silicon film (not shown) is patterned to form an active layer of a thin film transistor indicated by 202 in FIG. 2(A). Next, a silicon oxide film 203 serving as a gate insulation film is formed to a thickness of 1000 Å using the plasma CVD or sputtering.

An aluminum film (not shown) including 0.2 % scandium by weight is formed to a thickness of 5000 Å using sputtering. The purpose of the inclusion of a very small amount of scandium in the aluminum film is to suppress the generation of hillocks and whiskers. Hillocks and whiskers are horn-shaped or thorn-shaped projections formed as a result of abnormal growth of aluminum.

Next, the aluminum film is patterned to form a gate wiring 101 and a gate electrode 110 extending from the gate wiring 101. Further, the shorting wiring 100 extending from the gate wiring 101 is formed simultaneously.

Although not shown in FIG. 2, a shorting wiring indicated by 109 in FIG. 1 is also simultaneously formed in this step. The gate wiring 101, the gate electrode 110 extending from the gate wiring, and the shorting wiring 100 extending from the gate wiring 101 are referred to as "a first layer wiring".

Further, as described in detail later with reference to another embodiment, the shorting wiring is provided with a pattern for reducing or eliminating a high potential pulse which has been discharged or induced therein.

Next, anodization is performed in an electrolytic solution with the gate electrode 110, gate wiring 101, and shorting wirings 100 and 109 extending from the gate wiring acting as an anode. In this step, anodic oxide films 204 and 205 shown in FIG. 2(A) are formed.

The anodic oxide films are formed to a thickness of 500 Å. The anodic oxide films are effective for suppressing the generation of hillocks to prevent the occurrence of shorting between the wirings. Thus, a state as shown in FIG. 2(A) is obtained.

The anodization step uses ethylene glycol solution including 3 % tartaric acid neutralized by aqueous ammonia as the electrolytic solution. Further, it is performed by flowing a current in this electrolytic solution between an aluminum pattern and platinum serving as the anode and cathode, respectively.

Then, impurity ions are implanted in the state as shown in FIG. 2(A). In this step, a source region 211 and a drain region 212 are formed in a self alignment manner (FIG. 2(B)).

Next, a silicon oxide film or silicon nitride film is formed as a first interlayer insulation film 206 to a thickness of 5000 Å using plasma CVD. A laminated film consisting of a silicon oxide film and a silicon nitride film or a silicon oxide nitride film may be used as this interlayer insulation film. A silicon oxide nitride film is formed using plasma CVD utilizing gas mixture of a TEOS gas and an $N_2O$ gas as the gas source.

Next, contact holes are formed using dry etching. The recent trend toward finer patterns is promoting the use of dry etching method in which anisotropic etching can be utilized.

Even if dry etching is used, a thin film transistor under fabrication is prevented from being destroyed by a high potential pulse induced by plasma. This is because the wirings and electrodes are connected to each other to have the same potential, which prevents a great potential difference from being applied to, for example, the gate insulation film 203.

Next, a three-layer film consisting of a titanium film, an aluminum film, and another titanium film is formed as second layer wirings. The three-layer film is formed using sputtering. The generation of a great potential difference between the wirings and electrodes is also suppressed in this case.

Figure 2B:
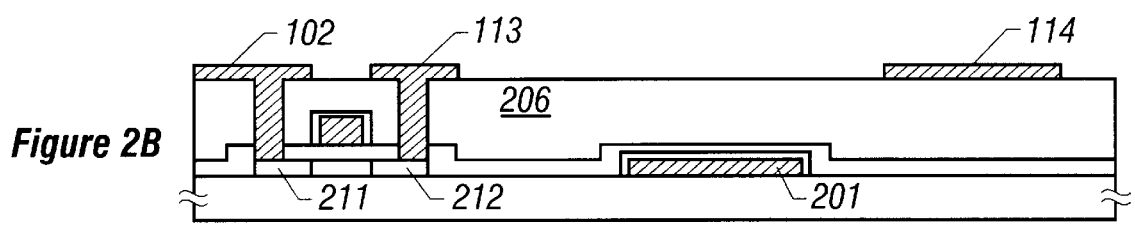

The three-layer film formed as described above is then patterned to form the source wiring 102 (which extends to contact the source region 211), a drain electrode 113, and the shorting wiring 114 which extends from the source wiring 102 (FIG. 2(B)).

These electrodes and wirings are referred to as "a second layer wiring". The relationship between the positions where these electrodes and wirings are provided is as shown in FIG. 1.

As apparent from FIGS. 2(A) through 2(E), the first layer wiring (indicated by a solid line in FIG. 1) formed by the gate electrode 110 extending from the gate wiring 101 (see FIG. 1) and the wiring 100 extending from the gate wiring 101 are separated in a horizontal direction by the interlayer insulation film 206 from the second layer wiring (indicated by a dotted line in FIG. 1) formed by the source wiring 102 and the wiring 114 extending from the source wiring. But, these wirings are connected to each other (shorted) through the shorting wiring 109 as shown in FIG. 1.

Figure 2C:
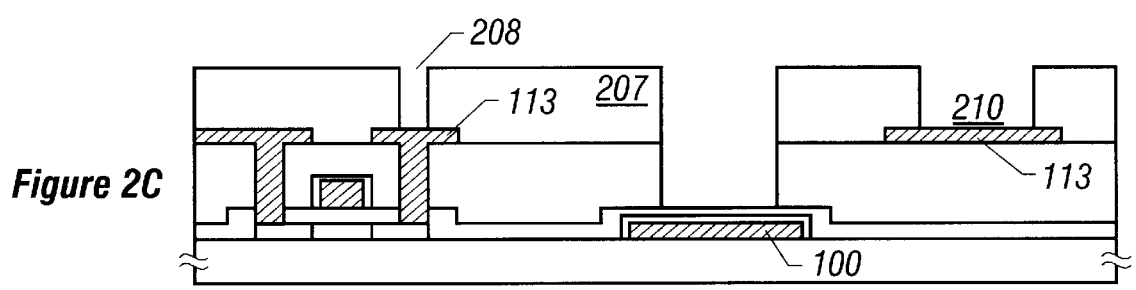
Figure 2D:
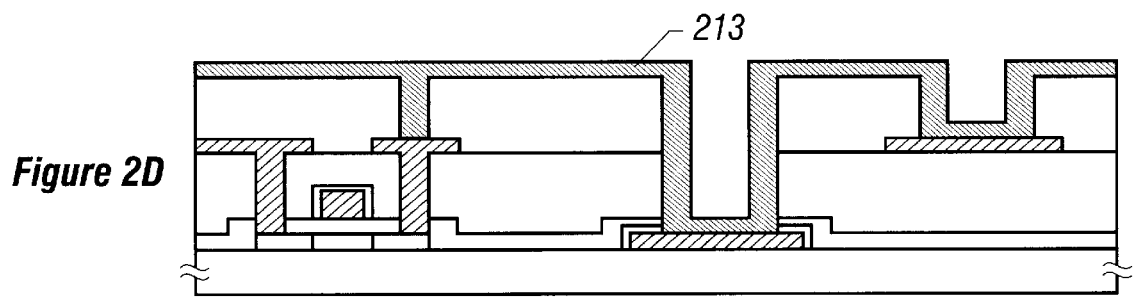

After the state shown in FIG. 2(B) is obtained, a silicon oxide film or silicon nitride film is then formed as a second layer insulation film 207 (FIG. 2(C)).

When the second layer insulation film 207 is formed, all electrodes and wirings are shorted. Therefore, it is possible to suppress the generation of an unnecessary potential difference under the influence of plasma. Further, it is possible to suppress the generation of defects due to local application of a high voltage.

Further, a contact hole 208 for connecting the drain electrode 113 and a pixel electrode 214 to be formed later (see FIG. 2(E)) is formed.

Figure 2E:
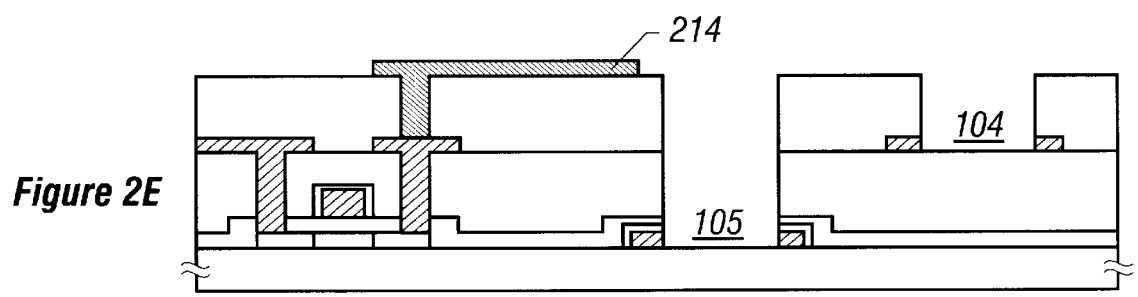
Figure 3:
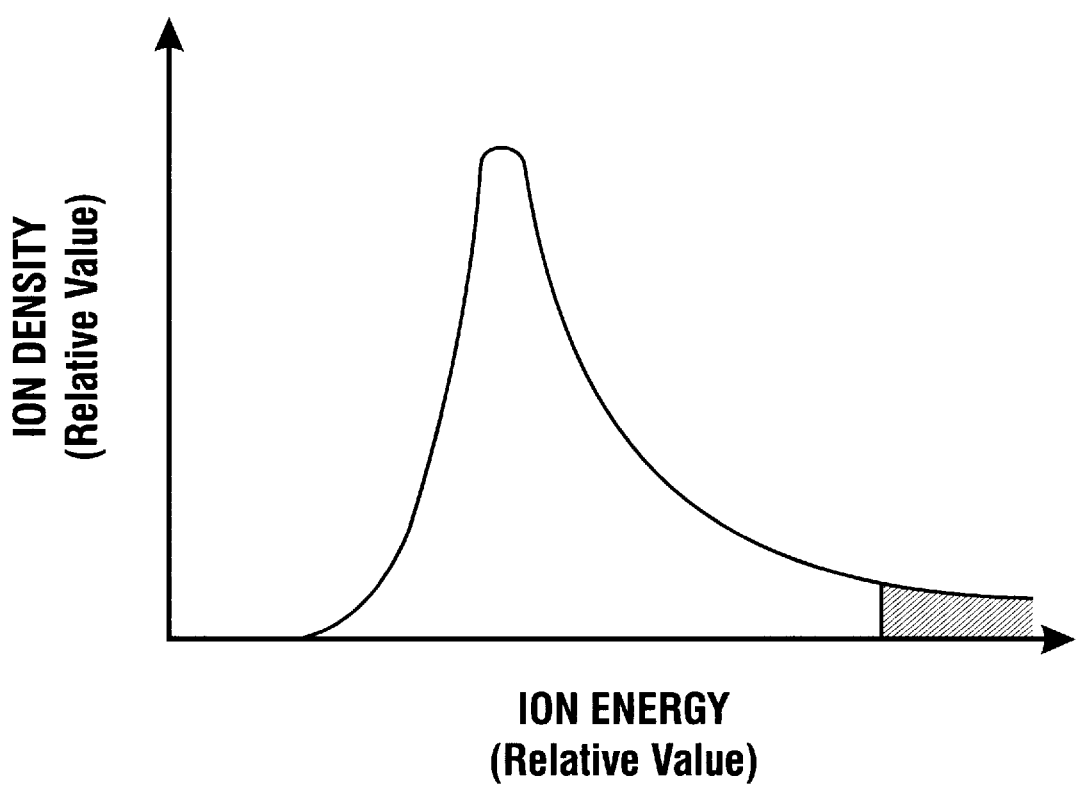
FIG. 3 shows the distribution of ion energy in plasma.
Figure 4A:
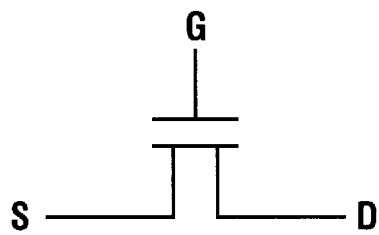
FIGS. 4(A) and 4(B) show steps of manufacturing a conventional thin film transistor.
Figure 4B:
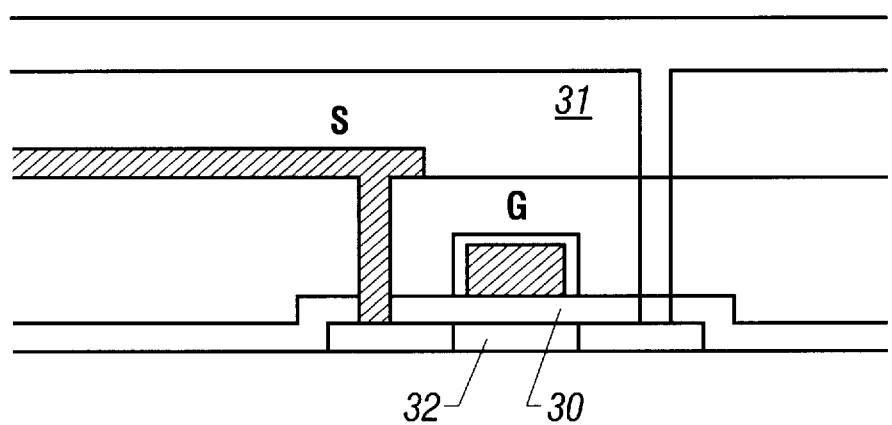

Further, an opening 209 is simultaneously formed to expose the shorting wiring 100 extending from the gate wiring 101 which is a first layer wiring at a region 105 (see FIG. 2(E)).

Furthermore, an opening 210 is simultaneously formed to expose the shorting wiring 114 extending from the source wiring 102 which is a second layer wiring at a region 104 (see FIG. 2(E)).

Those openings are also formed using dry etching. In this step, it is again possible to suppress the influence of a high potential induced by plasma between the wirings and electrodes because the wirings and electrodes are connected to each other to be at the same potential.

As apparent from FIG. 2(C), the openings 209 and 210 extending to the first layer wiring 100 and the second layer wiring 114 are formed in this step, simultaneously.

Next, an ITO film 213 is formed using sputtering for forming a pixel electrode. During the formation of this pixel electrode, it is again possible to suppress the generation of an unnecessary potential difference between the wirings and electrodes under the influence of plasma because the wirings and electrodes are at the same potential.

Especially, it is important that the insulation films and pixel electrode are formed in a state wherein the gate wiring 101 which is a first layer wiring indicated by a solid line in FIG. 1 and the second layer wiring 102 indicated by a dotted line are shorted. The film formation (and dry etching) in such a state makes it possible to suppress the application of a high voltage between the first layer wiring and the second layer wiring.

As a result, for example, it is possible to avoid a situation such that a high voltage is applied between the above-described gate electrode 110 and the active layer 202. That is, the application of a high voltage to the gate insulation film 203 can be suppressed.

Next, the ITO film 213 is patterned. This patterning is also performed by means of dry etching. The wirings 100 and 114 are removed in the regions 105 and 104 indicated in FIG. 2(E) by this dry etching.

Thus, the wirings 100 and 114 are cut (disconnected) at the regions 105 and 104.

FIG. 2(E) shows the state in which the wirings are disconnected at the regions 104 and 105. Further, the disconnection of the wiring 109 in the region 103 is also simultaneously performed at the same step.

Thus, the circuit configuration of a pixel region of an active matrix type liquid crystal display is completed.

In the present embodiment, wirings and electrodes which undesirably function as antennas are electrically shorted to be at the same potential during steps utilizing plasma. Therefore, even when a high potential is locally induced by plasma, it is possible to prevent a thin film transistor under fabrication from being destroyed by such.

A second embodiment of the present invention will now be described.

Figure 5A:
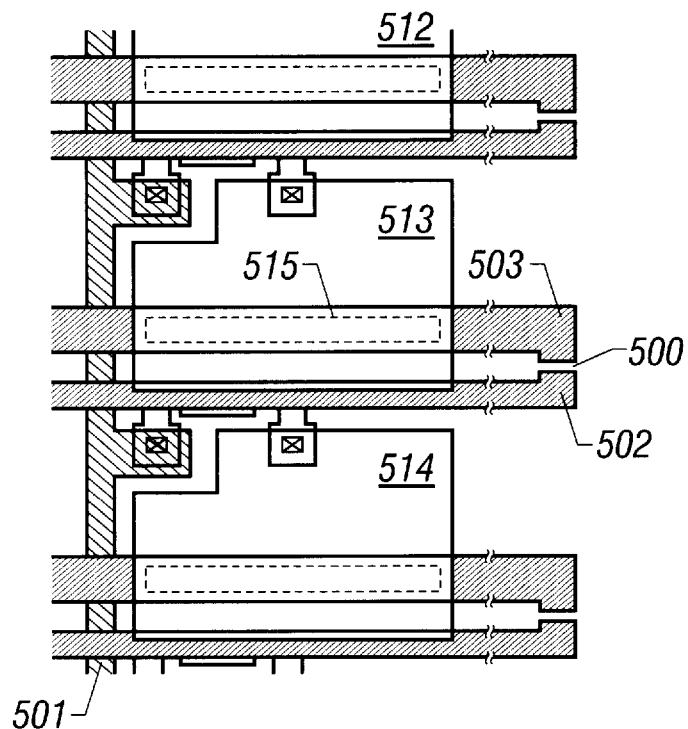
FIGS. 5(A) and 5(B) show an example of an active matrix type circuit.
Figure 5B:
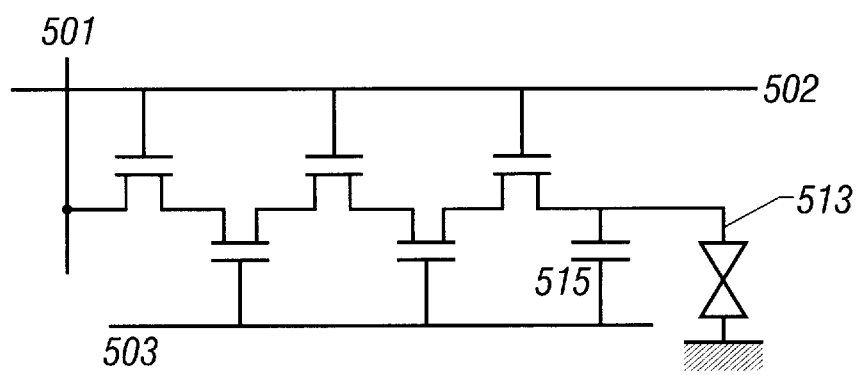

The present embodiment relates to a configuration of a pixel region of an active matrix type liquid crystal display having an equivalent circuit as shown in FIG. 5(B). FIG. 5(A) shows a configuration having the equivalent circuit as shown in FIG. 5(B) as viewed from the above.

In FIGS. 5(A) and 5(B), 502 designates a gate wiring and 501 designates a source wiring. The gate and source wirings are provided in the form of a matrix, and pixel electrodes indicated by 512, 513, and 514 are provided in the region surrounded by the two wirings.

In the configuration shown in FIG. 5(A), the gate wiring 502 and a capacity wiring 503 traverse over a semiconductor layer (active layer) provided in the form of "M" to provide a circuit configuration as shown in FIG. 5(B).

As apparent from FIG. 5(B), the circuit will not operate if the gate wiring 502 and capacity wiring 503 are directly connected. Further, the gate wiring 502 and capacity wiring 503 are formed by patterning the same conductive film.

In such a configuration, there is a possibility that a high voltage be applied between the gate wiring 502 and capacity wiring 503 when, for example, an insulation film is formed to cover those wirings. As apparent from FIG. 5(B), if a high voltage is applied between the gate wiring 502 and capacity wiring 503, a transistor and a MOS capacity formed between them are destroyed.

Taking this into consideration, the configuration of the present embodiment is characterized in that the gate wiring 502 and capacity wiring 503 are connected at a region indicated by 500 until a pixel electrode 513 (this pixel electrode is formed at the final stage) is formed, and the region 500 is cut when the pixel electrode 513 is patterned.

Such a configuration makes it possible to prevent a high voltage from being applied between the gate wiring 502 and capacity wiring 503 with no increase in manufacturing steps.

A third embodiment of the present invention will now be described.

The present embodiment relates to the shape of the patterns of the shorting wirings 109, 114, and 100 shown in FIG. 1.

A pulse-like high potential induced by plasma is generated by local abnormal discharge. Therefore, the locations where a pulse-like high potential is induced are unspecified local regions.

In the case of an active matrix region having a large area, a high potential pulse induced by plasma may be propagated in wiring over a long distance. In such a case, the influence of a high potential pulse propagated as described above is concern, even if the wirings and electrodes are at the same potential.

The present embodiment relates to a configuration which is effective in such a case. In the present embodiment, patterns as shown in FIGS. 6(A) and 6(B) is formed in a part of the shorting wirings 109, 114, and/or 100.

Figure 6A:
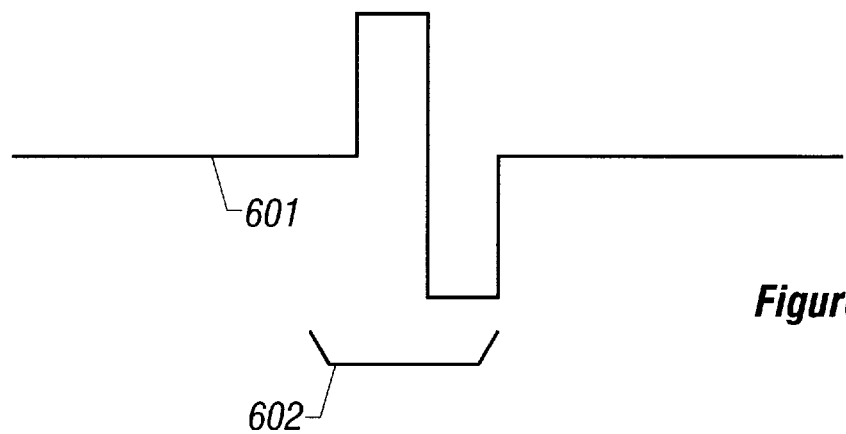
FIGS. 6(A) and 6(B) show examples of a discharge pattern in accordance with an embodiment of the invention.

FIG. 6(A) shows a wiring pattern for reducing or eliminating a high potential pulse waveform which has been propagated through a line 601 at a region indicated by 602. The purpose of this wiring pattern is to cause collision of the pulse at the region indicated by 602 to thereby discharge the energy in that region.

It is effective to provide the pattern shown in FIG. 6(A) in the middle of or at an end of the shorting wirings indicated by 100 and 114. This is effective in preventing a high potential pulse from coming and going the lines many times.

Figure 6B:
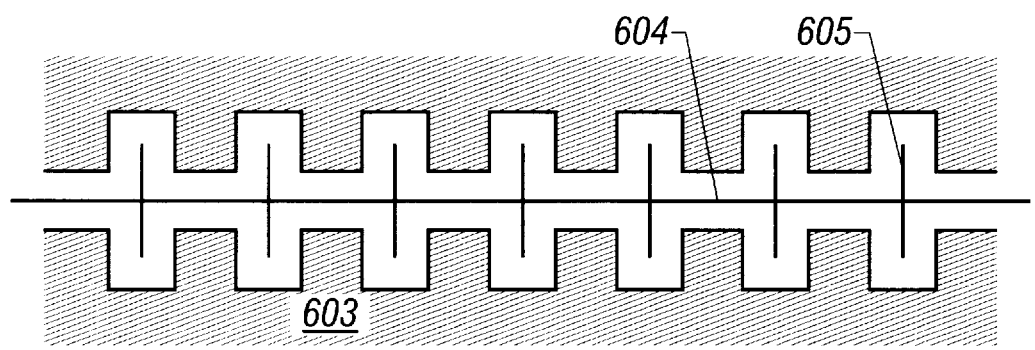

FIG. 6(B) shows a line 604 including a pattern 605 for discharge which is surrounded by a solid-printed line 603 having the ground potential.

It is also effective to provide such a pattern at an end of the shorting wirings indicated by 100 and 114. Further, it is effective also when provided in a connection between an active matrix region and a peripheral driving circuit region.

The pattern in accordance with this embodiment may be understood that the impedance of the wiring locally changes (either increases or decreases) by the provision of the pattern, thus, impeding the propagation of the high frequency pulses through the wiring.

Figure 7:
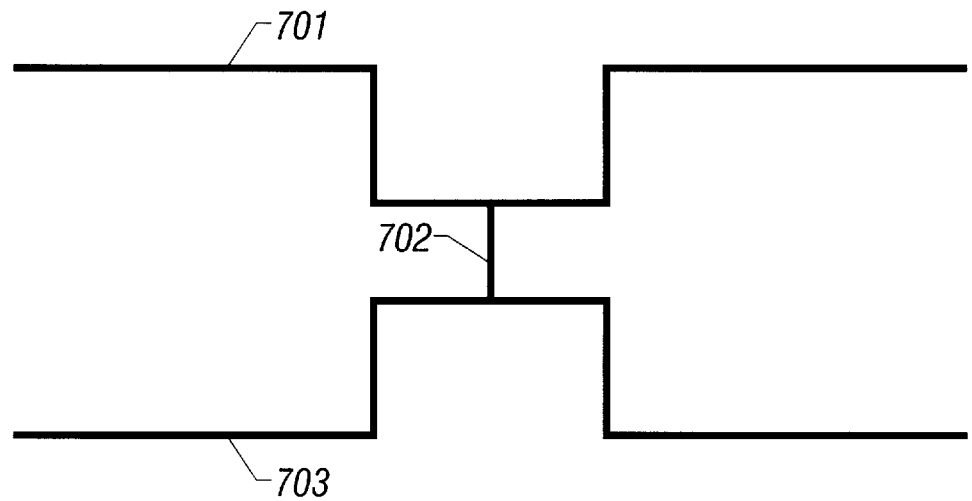
FIG. 7 illustrates a wiring pattern in accordance with the present invention.

In FIG. 7, two neighboring lines 701 and 703 are connected by a wiring pattern 702. Such a configuration has a function in which high potential pulses propagated through the lines 701 and 703 collide to each other at the pattern region 702 and are discharged there.

It is effective to provide the pattern shown in FIG. 7 at an end of the shorting wirings indicated by 100 and 114 and in an area out of the active matrix region. By providing the pattern as shown in FIG. 7, it is possible to prevent high potential pulses from being propagated in all directions in an active matrix circuit.

The invention disclosed in this specification makes it possible to prevent the destruction of a semiconductor device under fabrication due to a pulse-like high potential induced by plasma. Especially, this can be achieved without adding any special fabrication step.

The active matrix device in accordance with the present invention can be employed for an electro-optical device such as a liquid crystal display or an electro-luminscence display. The electro-optical device may be used in the following electronic devices.

Figure 8A:
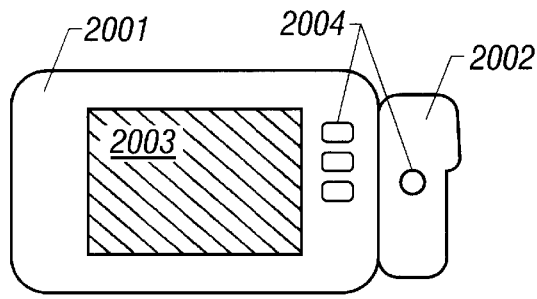
FIGS. 8(A) to 8(D) show examples of applications utilizing the electro-optical device of the present invention.

FIG. 8(A) shows a device called as a digital steel camera or an electron camera. The device has a function of saving an image photographed with CCD camera electronically. The CCD camera is arranged at a camera part 2002. Also, the device has a function of displaying the image in the display device 2003 arranged in the body 2001. Moreover, it is well known the device having all kinds of communication facility and information memory means to be utilized as an information terminal. The operation of the device is conducted by the operation button 2004.

Figure 8B:
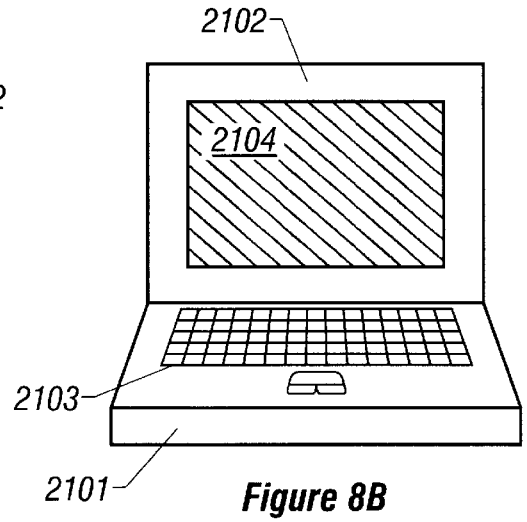

FIG. 8(B) shows a portable personal computer. The device has a display device 2104 on the cover 2102, which can open and close, and it can input information of all kinds from a keyboard 2103 and conduct various operation.

Figure 8C:
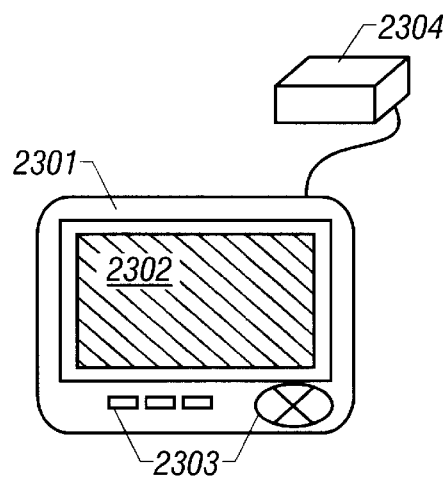

FIG. 8(C) shows an example of a car navigation system utilizing a flat panel display. The car navigation system has a body composed of an antenna part 2304 and a display device 2302. Changing over information of all kinds being necessary for navigation is conducted by an operation button 2303. Also, various kinds of operations are conducted by remote control device which is generally not shown.

Figure 8D:
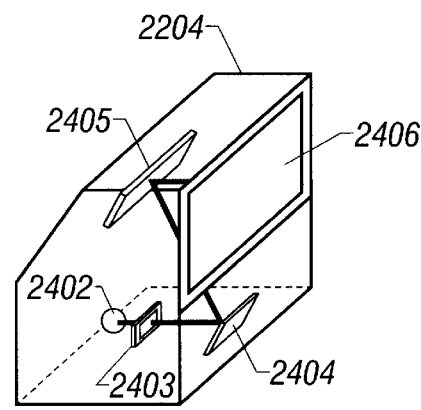

FIG. 8(D) shows an example of a projection type liquid crystal display device. In the figure, light radiated from a light source 2402 is modulated optically to be image by a liquid crystal display device 2403. The image is reflected by mirrors 2404 and 2405 to be projected on a screen 2406.

While the present invention has been described in conjunction with preferred embodiments, it is to be understood that the scope of the invention should not be limited to the particular structures disclosed in those embodiments.

What is claimed is:

1. A method of manufacturing a semiconductor device comprising the steps of:

forming a first wiring including a gate electrode for a thin film transistor over a substrate;

forming an interlayer insulator on said first wiring;

forming a second wiring on said interlayer insulator, said second wiring being connected to one of source and drain regions of said thin film transistor;

forming a second interlayer insulator on said second wiring;

forming a conductive film on said second interlayer insulator; and then patterning said conductive film by etching, wherein said first and second wirings are shorted with each other at least during the formation of said second interlayer insulator and said conductive film; and wherein at least one of said first and second wirings is provided with a discharge pattern.

2. The method of claim 1 wherein the formation of said second interlayer insulator is carried out by using a plasma.

3. The method of claim 1 wherein the formation of said conductive layer is carried out by using a plasma.

4. The method of claim 1 wherein said first and second wirings are electrically separated from each other by said patterning step.

5. A method of manufacturing an active matrix device comprising the steps of:

providing a first plurality of wirings extending in a column direction;

forming a first interlayer insulator on said first plurality of wirings;

providing a second plurality of wirings extending in a row direction orthogonal to said column directions;

forming a second interlayer insulator on said second plurality of wirings;

forming a conductive film on said second interlayer insulator; and patterning said conductive film by etching, wherein at least one of said first and second plurality of wirings is provided with a discharge pattern, and wherein said first plurality of wirings are shorted with each other via a shorting wiring during the formation of said second interlayer insulator and said shorting wiring is disconnected by said patterning step.

6. The method of claim 5 wherein said first plurality of wirings are electrically connected with said second plurality of wirings and are separated therefrom by said patterning step of the conductive film.

7. A method of manufacturing an active matrix device comprising the steps of:

providing a plurality of wirings for an active matrix circuit over a substrate;

forming an insulating film on said plurality of wirings;

forming a conductive film on said insulating film; and patterning said conductive film, wherein said wirings are provided with a lead having a discharge pattern, and wherein said lead is disconnected by said patterning step.

8. The method of claim 7 wherein said plurality of wirings are electrically connected with each other at least during the formation of said insulating film and said conductive film and are electrically disconnected from each other by said patterning step.

9. A method of manufacturing an active matrix device comprising the steps of:

providing a plurality of wirings for an active matrix circuit over a substrate;

forming an insulating film on said plurality of wirings;

forming a conductive film on said insulating film; and patterning said conductive film, wherein said wirings are provided with a discharge pattern, and wherein said discharge pattern is separated from said plurality of wirings by said patterning step.

10. The method of claim 9 wherein said plurality of wirings are electrically connected with each other at least during the formation of said insulating film and said conductive film and are electrically disconnected from each other by said patterning step.

11. A method of manufacturing an electro-optical device comprising the steps of:

preparing a first plurality of column lines including gate electrodes for thin film transistors over a substrate, said column lines being electrically shorted with each other through a first shorting wiring;

forming an interlayer insulator on said first plurality of column lines;

preparing a second plurality of row lines connected to a source of said thin film transistors and extending orthogonal to said column lines, said row lines being electrically shorted with each other through a second shorting wiring; and then disposing said substrate to a plasma for conducting a plasma processing.

12. The method of claim 11 wherein said plasma processing is at least one of sputtering, plasma CVD, and plasma etching.

13. A method of manufacturing an electro-optical device comprising the steps of:

preparing a first plurality of column lines including gate electrodes for thin film transistors over a substrate;

forming an interlayer insulator on said first plurality of column lines;

preparing a second plurality of row lines connected to a source of said thin film transistors and extending orthogonal to said column lines; and then disposing said substrate to a plasma for conducting a plasma processing, wherein said first plurality of column lines and said second plurality of row lines are electrically connected to a same potential in order to prevent a damage of said thin film transistor caused by said plasma processing.

14. The method of claim 13 wherein said plasma processing is at least one of sputtering, plasma CVD, and plasma etching.

15. A method of manufacturing an electro-optical device comprising the steps of:

preparing a first plurality of column lines including gate electrodes for thin film transistors over a substrate;

forming an interlayer insulator on said first plurality of column lines;

preparing a second plurality of row lines connected to a source of said thin film transistors and extending orthogonal to said column lines; and then disposing said substrate to a plasma for conducting a plasma processing, wherein at least one of said first and second wirings is provided with a lead having a portion at which an impedance locally changes.

16. The method of claim 15 wherein said plasma processing is at least one of sputtering, plasma CVD, and plasma etching.

* * * * *